(12) United States Patent
Singh et al.

(10) Patent No.: US 12,453,102 B2
(45) Date of Patent: Oct. 21, 2025

(54) VERTICAL MEMORY DEVICES

(71) Applicant: GLOBALFOUNDRIES U.S. Inc., Malta, NY (US)

(72) Inventors: Sunil Kumar Singh, Mechanicville, NY (US); Xuan Anh Tran, Boise, ID (US); Eswar Ramanathan, Mechanicville, NY (US); Suryanarayana Kalaga, Mechanicville, NY (US); Craig M. Child, Gansevoort, NY (US); Robert Fox, Greenfield Center, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 589 days.

(21) Appl. No.: 17/742,525

(22) Filed: May 12, 2022

(65) Prior Publication Data
US 2022/0271090 A1 Aug. 25, 2022

Related U.S. Application Data

(62) Division of application No. 16/439,101, filed on Jun. 12, 2019, now Pat. No. 11,367,750.

(51) Int. Cl.
*H10B 63/00* (2023.01)
*H10N 70/00* (2023.01)
*H10N 70/20* (2023.01)

(52) U.S. Cl.
CPC .......... *H10B 63/80* (2023.02); *H10B 63/845* (2023.02); *H10N 70/066* (2023.02); *H10N 70/24* (2023.02); *H10N 70/821* (2023.02); *H10N 70/826* (2023.02); *H10N 70/8418* (2023.02); *H10N 70/883* (2023.02); *H10N 70/8833* (2023.02); *H10N 70/8836* (2023.02)

(58) Field of Classification Search
CPC .... H10B 63/80; H10B 63/845; H10N 70/826; H10N 70/883
See application file for complete search history.

(56) References Cited

U.S. PATENT DOCUMENTS

| | | | |
|---|---|---|---|
| 7,560,337 B2 | 7/2009 | Ho et al. | |
| 8,143,612 B2 | 3/2012 | Lung et al. | |
| 8,963,114 B2 | 2/2015 | Liao et al. | |
| 9,305,977 B1* | 4/2016 | Hsu | H10B 63/30 |
| 9,391,271 B1* | 7/2016 | Hsu | H10B 63/84 |
| 9,583,167 B2 | 2/2017 | Chan | |
| 10,651,380 B1 | 5/2020 | Hsieh | |
| 2014/0264244 A1 | 9/2014 | Hong | |
| 2014/0268989 A1 | 9/2014 | Hong | |

(Continued)

OTHER PUBLICATIONS

Oh et al., "Full Integration of Highly Manufacturable 512Mb PRAM based on 90nm Technology", IEDM, 2006, 4 pages.

(Continued)

*Primary Examiner* — Aaron J Gray
(74) *Attorney, Agent, or Firm* — Andrew M. Calderon; Calderon Safran & Wright P.C.

(57) ABSTRACT

The present disclosure relates to semiconductor structures and, more particularly, to a vertical memory devices and methods of manufacture. The structure includes: a first bit cell with a first top electrode; a second bit cell with a second top electrode; and a common bottom electrode for both the first bit cell and the second bit cell.

9 Claims, 8 Drawing Sheets

(56) References Cited

U.S. PATENT DOCUMENTS

| | | |
|---|---|---|
| 2014/0268990 A1 | 9/2014 | Hong |
| 2016/0087197 A1 | 3/2016 | Tran |
| 2016/0322090 A1* | 11/2016 | Chan .................. H10B 61/20 |
| 2019/0067373 A1 | 2/2019 | Yang |
| 2019/0280047 A1 | 9/2019 | Indukuri |
| 2020/0381620 A1 | 12/2020 | Wu |

OTHER PUBLICATIONS

Hsieh et al., "Ultra high density 3D via RRAM in pure 28nm CMOS process", IEEE, 2013, 4 pages.

Chuang et al., "Effects of Electric Fields on the Switching Properties Improvements of RRAM Device With a Field-Enhanced Elevated-Film-Stack Structure", IEEE Journal of the Electron Devices Society, vol. 6, May 2, 2018, 5 pages.

* cited by examiner

VERTICAL MEMORY DEVICES

FIELD OF THE INVENTION

The present disclosure relates to semiconductor structures and, more particularly, to vertical memory devices and methods of manufacture.

BACKGROUND

Resistive random-access memory (ReRAM) is a type of non-volatile random-access (RAM) computer memory that works by changing the resistance across a dielectric solid-state material, often referred to as a memristor. ReRAM can be fabricated as vertical memory devices with a metal-insulator-metal configuration. The metal-insulator-metal configuration can include, for example, a top electrode, switching material and bottom electrode.

Although ReRAM can be seen as a replacement technology for flash memory, the cost and performance benefits of ReRAM have not been fully realized. For example, there are challenges in forming such ReRAM memory devices with a top electrode, switching materials and bottom electrode. These challenges include CMP (chemical mechanical polishing) process induced SiCN loss, as well as metal removal when forming the bottom electrode. In addition, recess etching processes result in a shorting to the bottom electrode resulting in significant performance issues.

SUMMARY

In an aspect of the disclosure, a structure comprises: a first bit cell with a first top electrode; a second bit cell with a second top electrode; and a common bottom electrode for both the first bit cell and the second bit cell.

In an aspect of the disclosure, a structure comprises: a bottom electrode in electrical contact with a lower metallization feature; a switching material on sides of the bottom electrode; a first top electrode on the switching material on a first side of the bottom electrode; and a second top electrode on the switching material on a second side of the bottom electrode, wherein the first top electrode and the second top electrode share the bottom electrode in a 2-bit cell configuration.

In an aspect of the disclosure, a method comprising: forming an opening in both a sacrificial material and an etch stop layer to expose a bottom metallization feature; forming a bottom electrode in the opening; removing the sacrificial material over the etch stop layer; depositing switching material on the bottom electrode; depositing top electrode material on the switching material; and patterning the switching material and the top electrode material to form a first top electrode and a second top electrode of a two bit cell with the bottom electrode common to both the first top electrode and the second top electrode.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to vertical memory devices and methods of manufacture. More specifically, the present disclosure relates to vertical resistive random-access memory (ReRAM) devices in a back end of line (BEOL) interconnect level and methods of manufacturing. Advantageously, the ReRAM devices avoid Mx (e.g., lower metal level) short to a bottom electrode due to over recess etching processes, while also reducing power consumption. As to the latter advantage, the ReRAM devices exhibit electric field focus at the corner of the top electrode which improves voltage applied reductions.

In embodiments, the ReRAM devices are comprised of a 2 bit-per cell sharing a same bottom electrode. More specifically, the present disclosure provides a memory device with a first bit cell with a first unique top electrode, a second bit cell with a second unique top electrode and a common or shared bottom electrode for both the first bit cell and the second bit cell. The common or shared bottom electrode with the two unique top electrodes allows for separate write and read operations.

The ReRAM devices of the present disclosure can be manufactured in a number of ways using a number of different tools. In general, though, the methodologies and tools are used to form structures with dimensions in the micrometer and nanometer scale. The methodologies, i.e., technologies, employed to manufacture the ReRAM devices of the present disclosure have been adopted from integrated circuit (IC) technology. For example, the structures are built on wafers and are realized in films of material patterned by photolithographic processes on the top of a wafer. In particular, the fabrication of the ReRAM devices uses three basic building blocks: (i) deposition of thin films of material on a substrate, (ii) applying a patterned mask on top of the films by photolithographic imaging, and (iii) etching the films selectively to the mask.

Figure 1A:
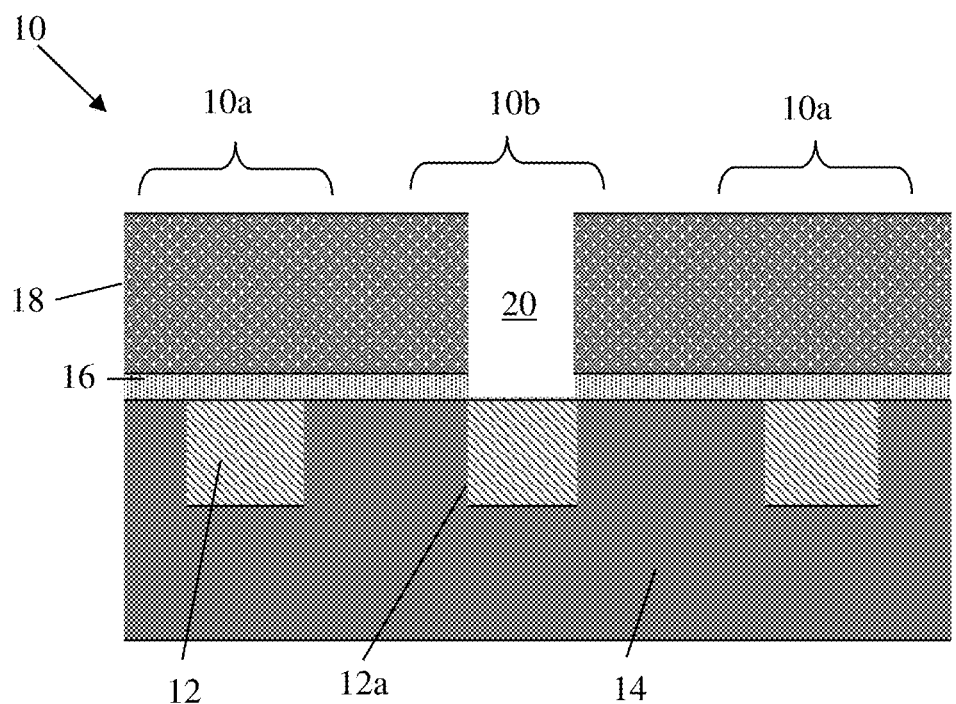
FIGS. 1A and 1B show cross-sectional views of metal layers of a bit cell, amongst other features, and respective fabrication processes in accordance with aspects of the present disclosure.
Figure 1B:
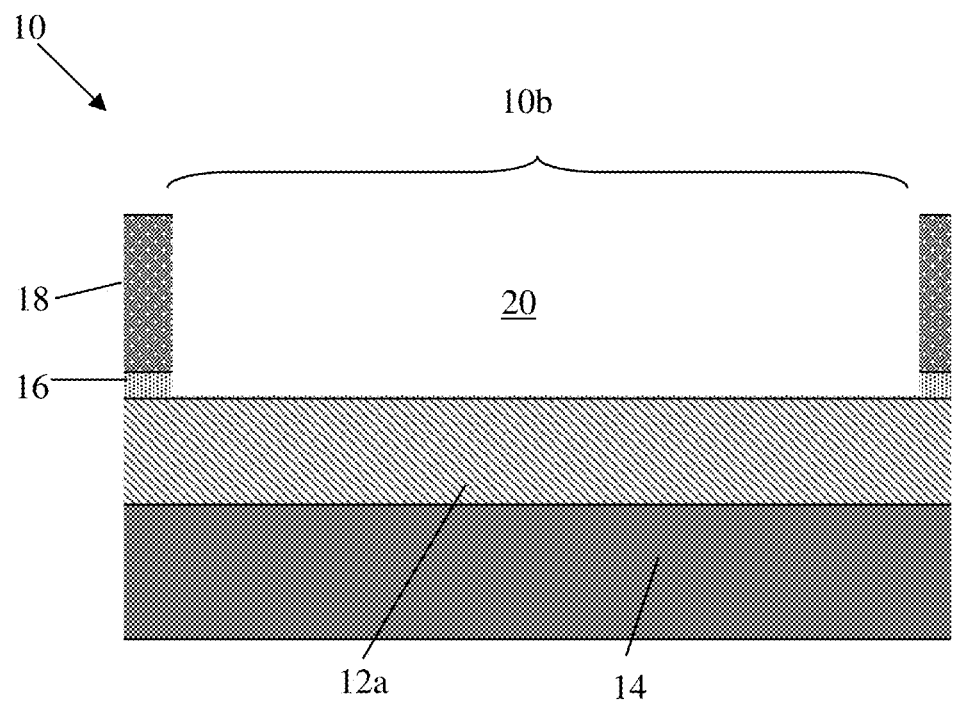

FIGS. 1A and 1B show cross-sectional views of metal layers of a bit cell, amongst other features, and respective fabrication processes in accordance with aspects of the present disclosure. More specifically, FIG. 1A shows a cross-sectional view perpendicular to a bitcell; whereas, FIG. 1B shows a cross-sectional view parallel to the bit cell. Referring now to both FIGS. 1A and 1B, the structure 10 includes a periphery or logic area 10a and a memory (e.g., ememory) area 10b. In embodiments, both the periphery or logic area 10a and memory area 10b include a plurality of metallization features 12, 12a, e.g., wiring structures or interconnect structures at a back end of line level, embedded within a dielectric material 14. In embodiments, the metallization features 12, 12a can be copper wiring lines or interconnects at a lower wiring level (Mx); although other conductive materials are also contemplated herein. The dielectric material 14 can be, for example, oxide.

The metallization features 12, 12a, e.g., wiring structures or interconnect structures, can be formed by conventional lithography, etching and deposition methods known to those of skill in the art. For example, a resist formed over the dielectric material 14 is exposed to energy (light) to form a pattern (opening). An etching process with a selective chemistry, e.g., reactive ion etching (RIE), will be used to form one or more trenches in the dielectric material 14 through the openings of the resist. The resist can then be removed by a conventional oxygen ashing process or other known stripants. Following the resist removal, conductive material can be deposited by any conventional deposition process, e.g., chemical vapor deposition (CVD) process. Any residual conductive material on the surface of the dielectric material 14 can be removed by conventional chemical mechanical polishing (CMP) processes.

Still referring to FIGS. 1A and 1B, an etch stop layer 16 is deposited over the dielectric material 14 and metallization features 12, 12a, in both the periphery or logic area 10a and memory area 10b. In embodiments, the etch stop layer 16 can be nitride, nitrogen-doped silicon carbide, or other materials that can hermetically seal the underlying metallization features 12, 12a. The etch stop layer 16 can be deposited by a conventional CVD process, deposited to a thickness of about 5 nm to about 50 nm and, more specifically, to a thickness of about 5 nm to about 15 nm. A sacrificial material 18 is deposited on the etch stop layer 16. In embodiments, the sacrificial material 18 is a material that has an etch selectivity to the etch stop layer 16, e.g., a material that can be etched without removing the underlying etch stop layer 16.

An opening 20 is formed in the etch stop layer 16 and sacrificial material 18 to expose the underlying metallization feature 12a in the memory area 10a. In embodiments, the opening 20 can be formed by conventional lithography and etching processes, e.g., RIE, with selective chemistries to both the etch stop layer 16 and sacrificial material 18. In embodiments, the sacrificial material 18 will protect the logic or periphery area 10b during the etching processes. Following the formation of the opening 20, any resist material used in the lithography and etching processes can be removed by using known stripants, for example.

Figure 2A:
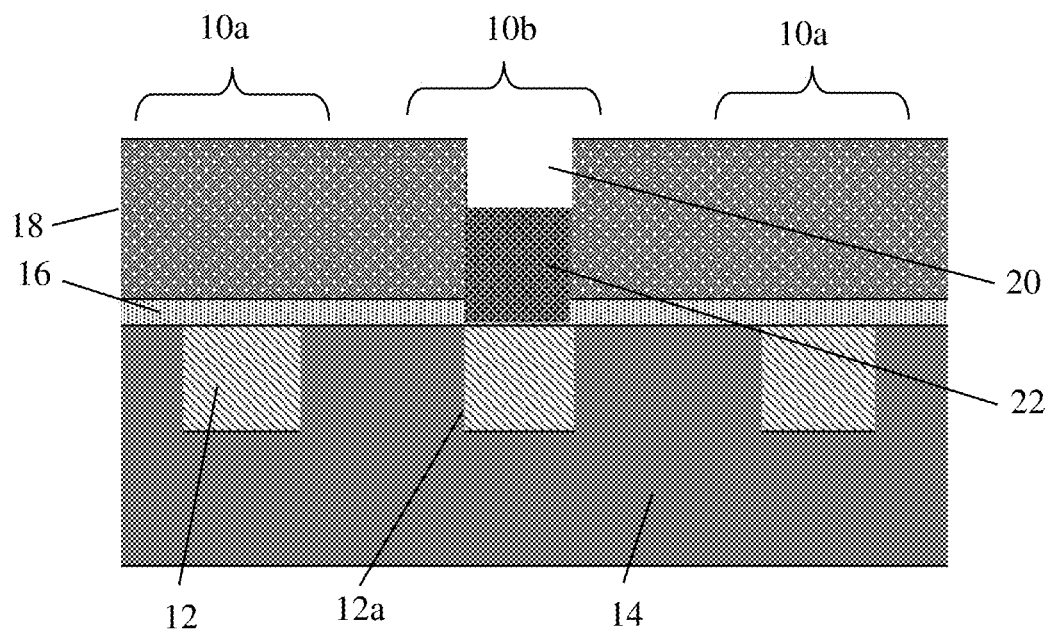
FIGS. 2A and 2B show cross-sectional views of a bottom electrode, amongst other features, and respective fabrication processes in accordance with aspects of the present disclosure.
Figure 2B:
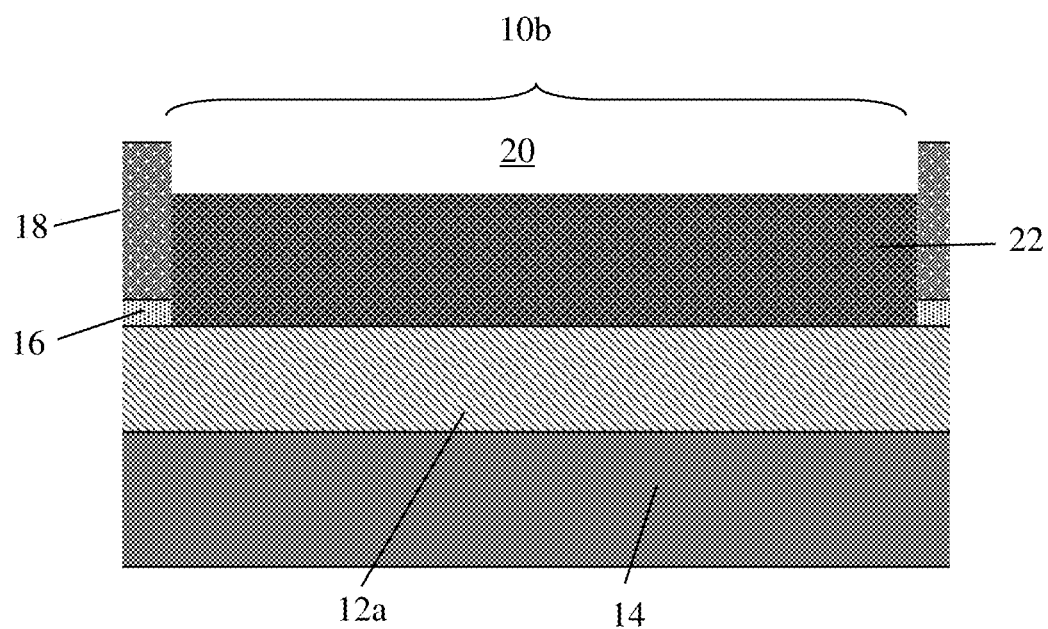

FIGS. 2A and 2B show cross-sectional views of a bottom electrode, amongst other features, and respective fabrication processes in accordance with aspects of the present disclosure. FIG. 2A shows a cross-sectional view perpendicular to the bitcell; whereas, FIG. 2B shows a cross-sectional view parallel to the bit cell. Referring now to both FIGS. 2A and 2B, a conductive material 22 is selectively deposited within the opening 20 and in direct contact with the underlying metallization feature 12a in the memory area 10a. In embodiments, the conductive material 22 will form the bottom electrode for two memory (bit) cells as described in more detail herein. The conductive material 22 can be, for example, Ru or Co or combinations thereof on copper. It should be understood by those of ordinary skill in the art, though, that other conductive materials and deposition processes can be used for forming of the electrodes as contemplated by the present disclosure.

Figure 2C:
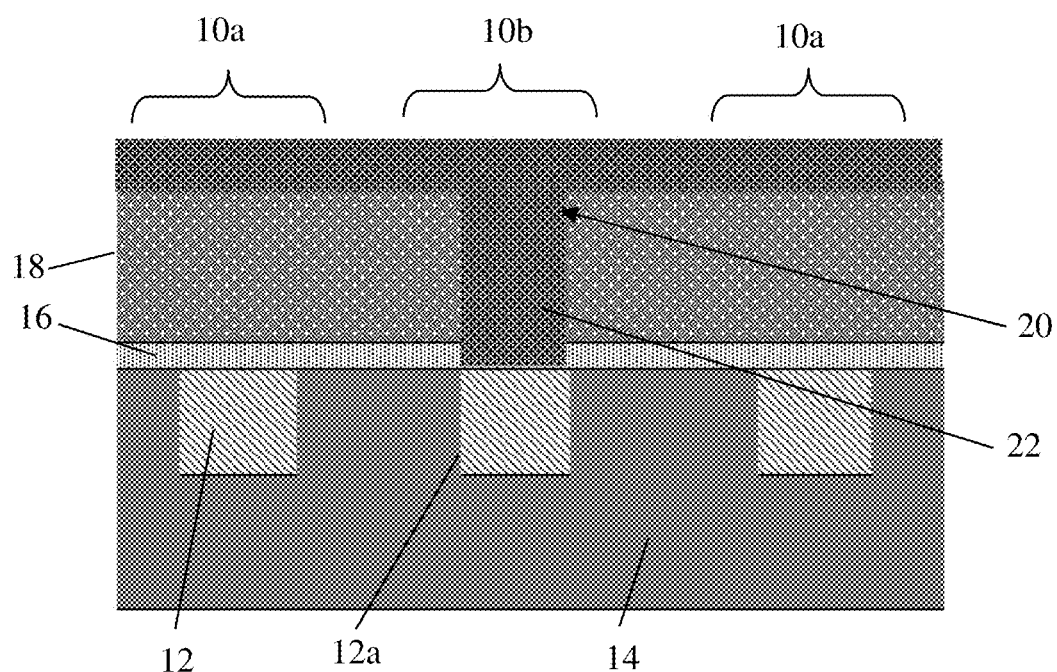
FIGS. 2C-2F show cross-sectional views for forming the bottom electrode, amongst other features, and respective fabrication processes in accordance with additional aspects of the present disclosure.
Figure 2D:
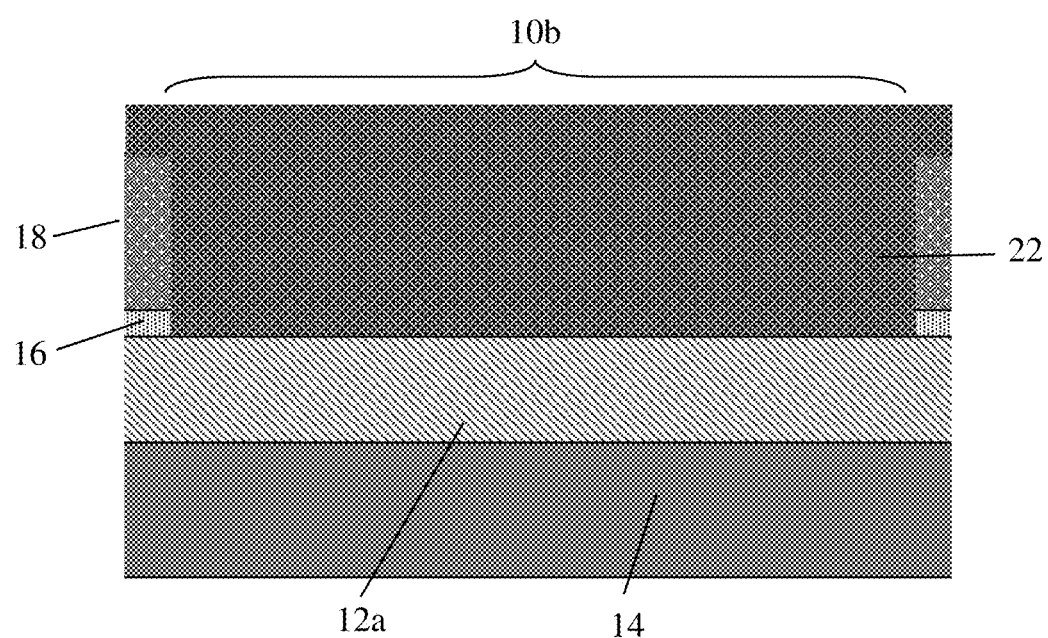
Figure 2E:
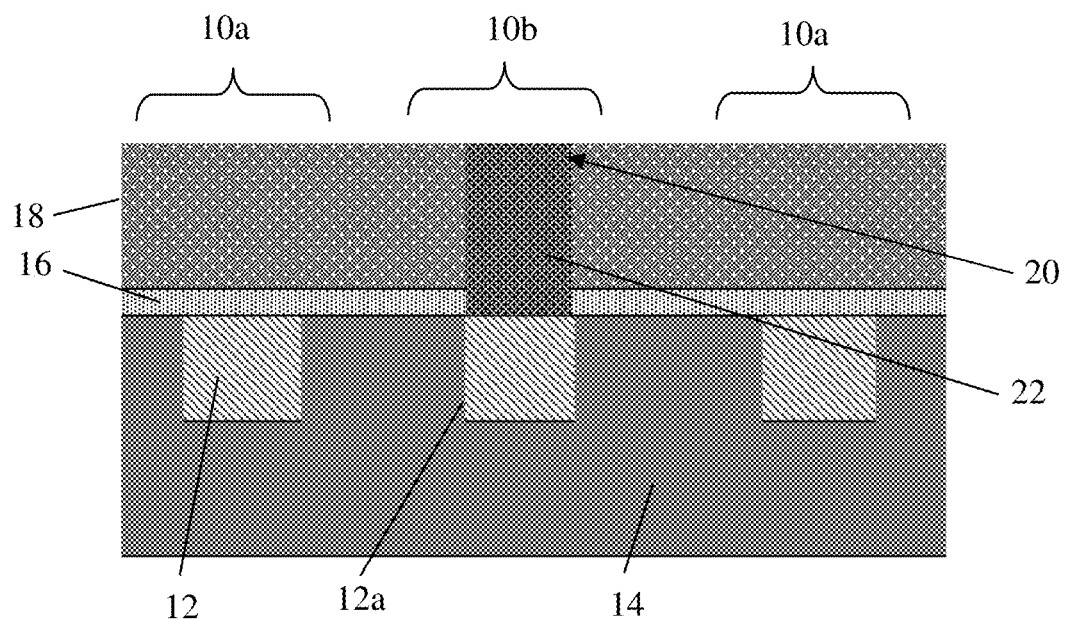
Figure 2F:
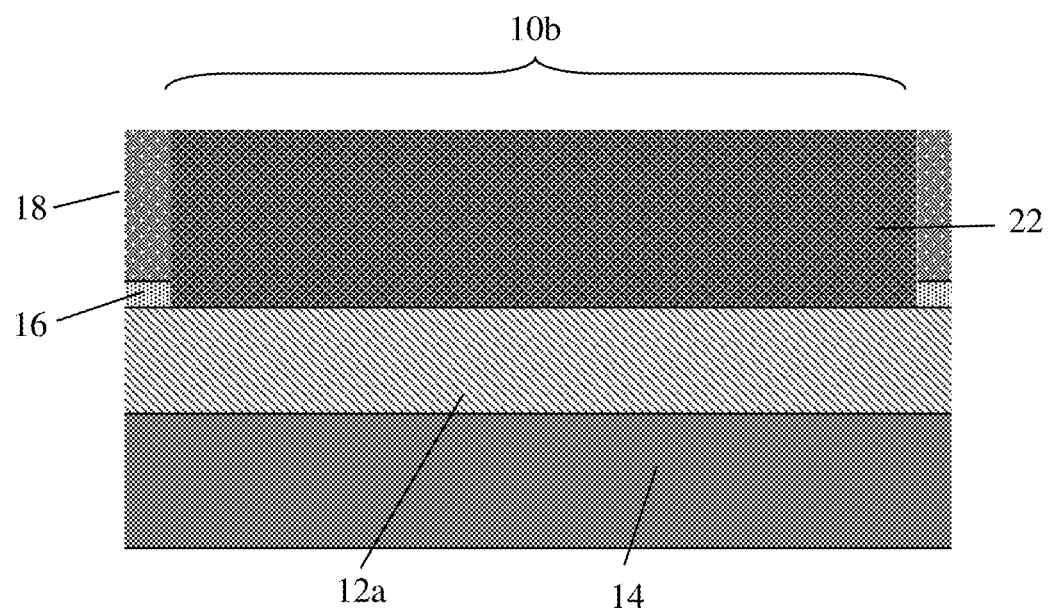

FIGS. 2C-2F show cross-sectional views for forming a bottom electrode, amongst other features, in accordance with additional aspects of the present disclosure. FIGS. 2C and 2E show a cross-sectional view perpendicular to the bitcell; whereas, FIGS. 2D and 2F show a cross-sectional view parallel to the bit cell. Referring to FIGS. 2C-2F, the conductive material 22 is blanket deposited within the opening 20 and on the sacrificial material 18. In embodiments, the blanket deposition process can be a CVD or plasma enhanced vapor deposition (PEVD) process, as non-limiting exemplary illustrations. This is compared to the selective deposition process shown in FIGS. 2A and 2B. Following the blanket deposition, excess conductive material 22 on the sacrificial material 18 is removed by a conventional CMP process, leaving the conductive material 22 in the opening 20 and in direct contact with the underlying metallization feature 12a in the memory area 10a.

Figure 3A:
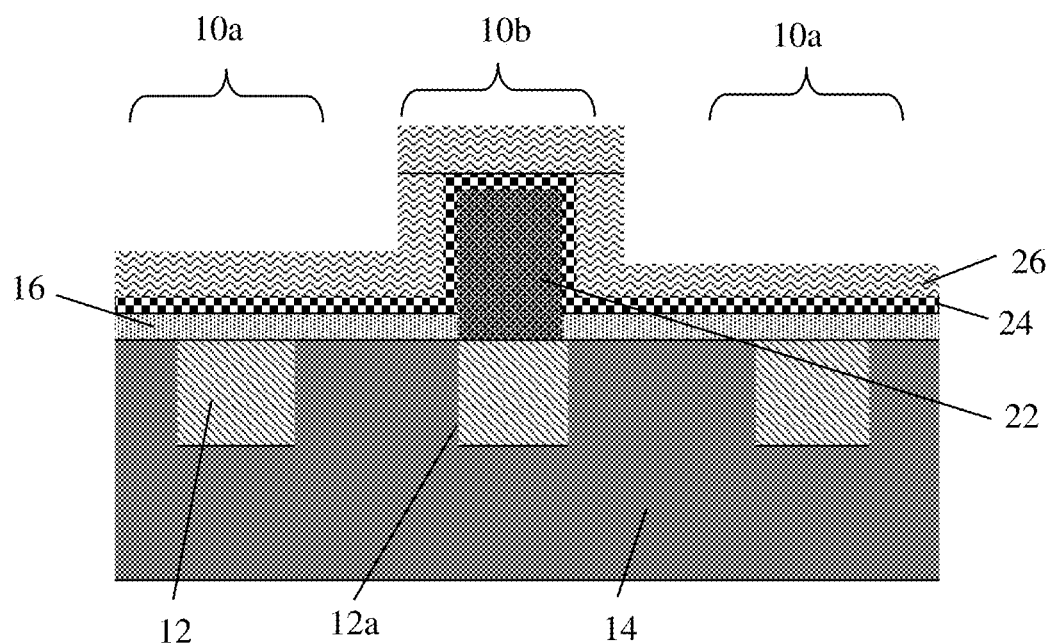
FIGS. 3A and 3B show cross-sectional views of a top electrode material, amongst other features, and respective fabrication processes in accordance with aspects of the present disclosure.
Figure 3B:
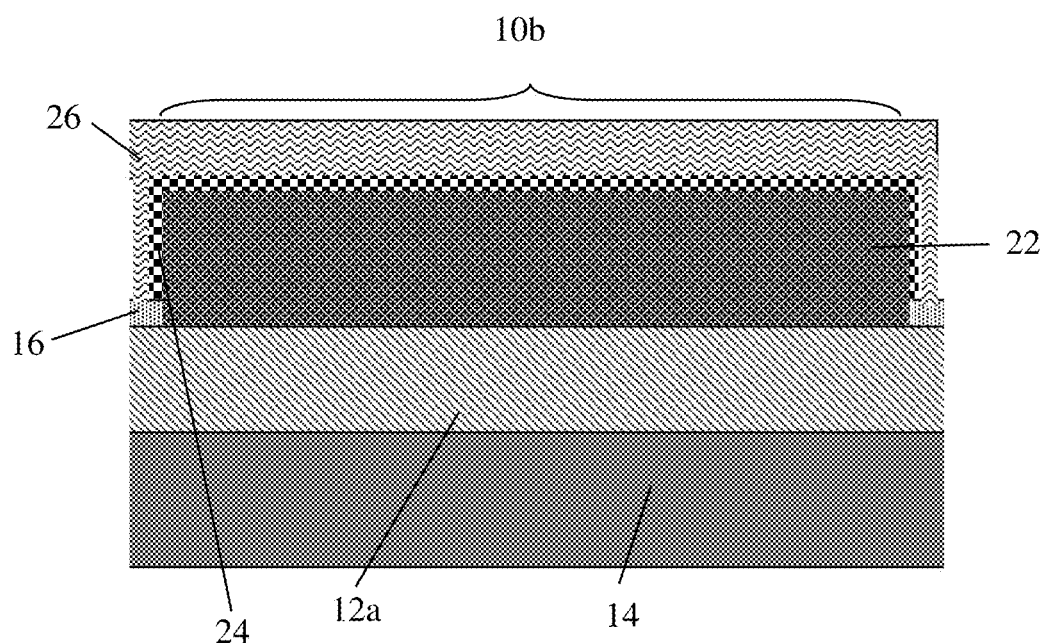

FIGS. 3A and 3B show cross-sectional views of a top electrode material, amongst other features, and respective fabrication processes in accordance with aspects of the present disclosure. FIG. 3A shows a cross-sectional view perpendicular to the bitcell; whereas, FIG. 3B shows a cross-sectional view parallel to the bit cell. Referring now to both FIGS. 3A and 3B, the sacrificial material is removed by a selective etching process with the etch stop layer 16 protecting the underlying metallization features 12. A switching material 24 is deposited over the etch stop layer 16. In embodiments, the switching material 24 can be a hafnium dioxide, silicon nitride or other high-k dielectric materials. For example, the switching material 24 can be, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. A top electrode material 26 is deposited on the switching material 24. In embodiments, the top electrode material 26 can TiN or other metal materials known to those of skill in the art. The top electrode material 26 can be deposited by a CVD process as a non-limiting example.

Figure 4A:
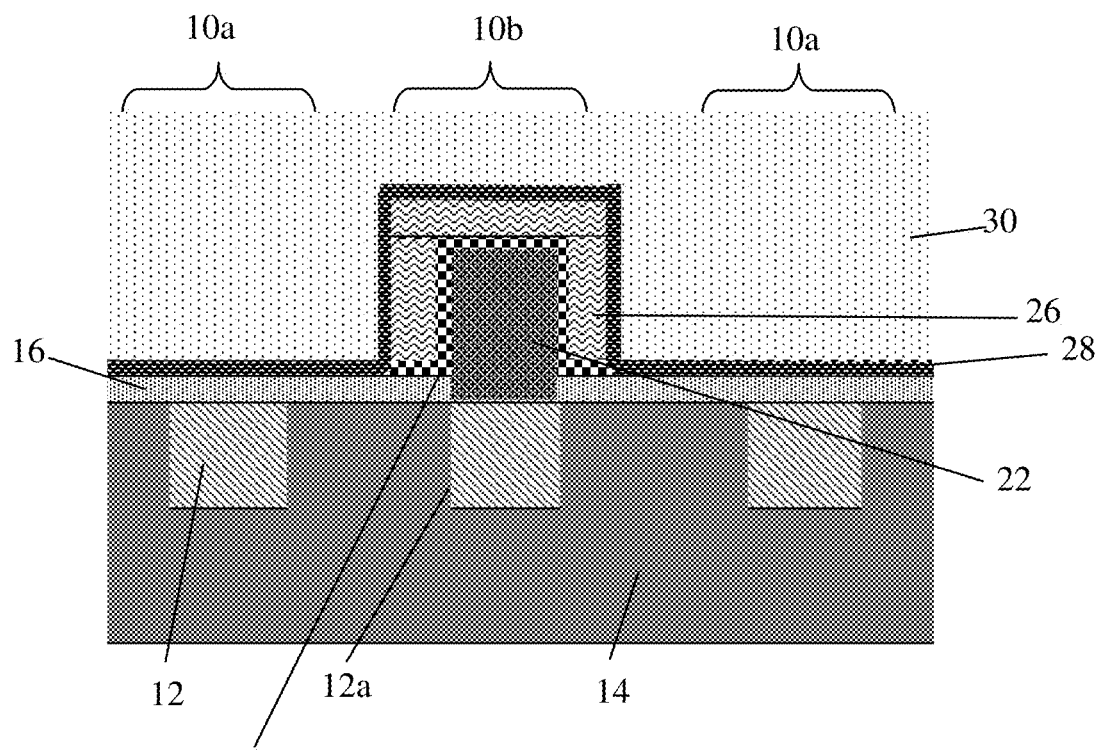
FIGS. 4A and 4B show cross-sectional views of a patterned top electrode, amongst other features, and respective fabrication processes in accordance with aspects of the present disclosure.
Figure 4B:
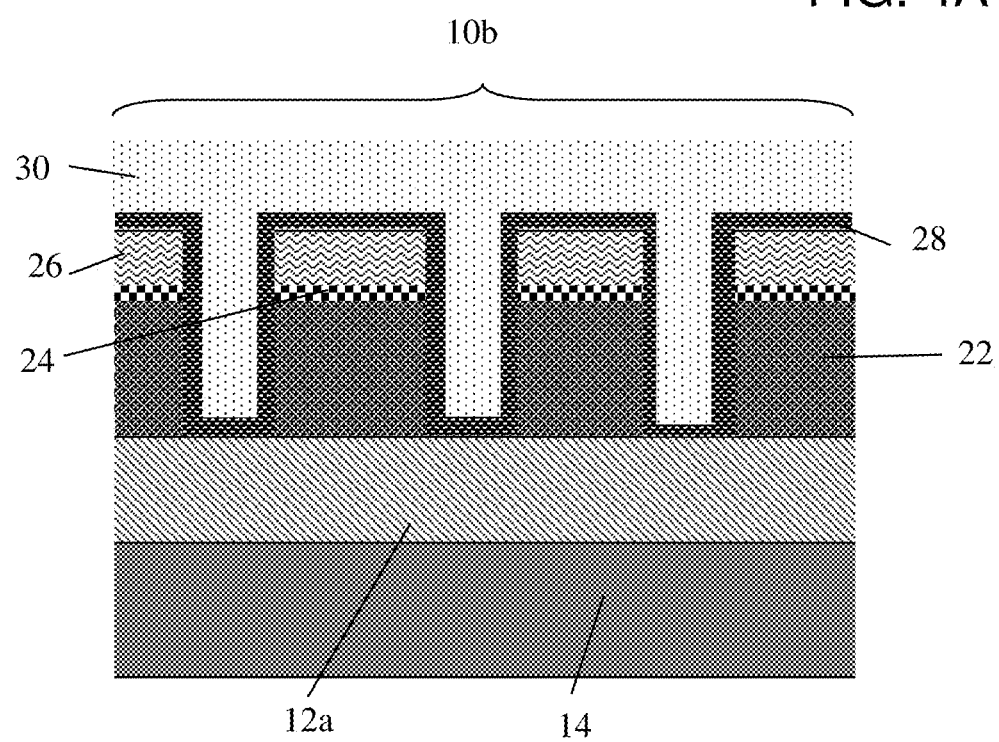

FIGS. 4A and 4B show cross-sectional views of a patterned top electrode material, amongst other features, and respective fabrication processes in accordance with aspects of the present disclosure. FIG. 4A shows a cross-sectional view perpendicular to the bitcell; whereas, FIG. 4B shows a cross-sectional view parallel to the bit cell. Referring now to both FIGS. 4A and 4B, the switching material 24 and the top electrode material 26 are patterned (e.g., cut) by using conventional lithography and etching processes. More specifically, in embodiments, the switching material 24 and the top electrode material 26 are cut, e.g., removed, from portions of the etch stop layer 16 using conventional lithography and etching processes known to those of ordinary skill in the art such that no further explanation is required. In this approach, the switching material 24 and the top electrode material 26 will remain on a top and sidewalls of the bottom electrode 22.

Following the cut process, an advance etch stop layer 28 is deposited on the remaining etch stop layer 16 and the switching material 24, as well as on the top electrode material 26 and the bottom electrode 22 (within the cut). In embodiments, the advance etch stop layer 28 is a bilayer film composed, for example, of AlN and oxygen-doped silicon carbide (ODC) deposited by a CVD process to a total thickness of about 15 nm to 50 nm. In more preferred embodiments, the AlN can have a thickness of about 2.5 nm to 5.0 nm and the ODC can have a thickness of about 4.0 nm to 7.0 nm. The advance etch stop layer 28 can be aluminum nitride or oxygen doped carbide, as illustrative non-limiting examples. An insulator material 30 is deposited over the advance etch stop layer 28 (including within the cuts). In embodiments, the insulator material 30 is an interlevel dielectric material such as oxide.

Figure 5A:
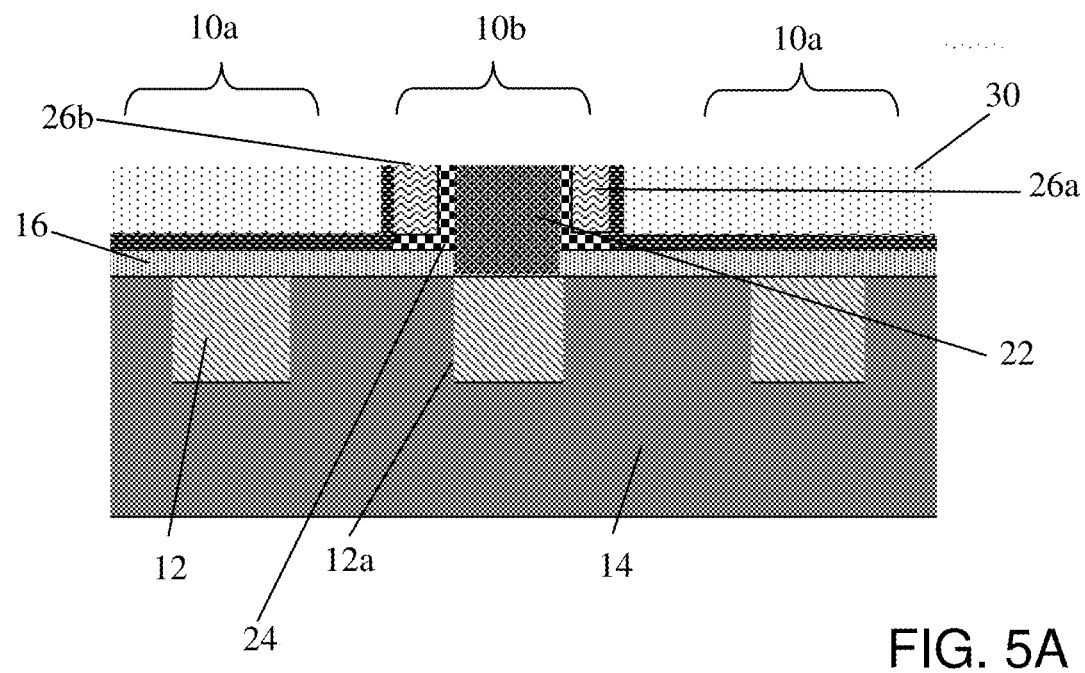
FIGS. 5A and 5B show cross-sectional views of the top electrode and a shared bottom electrode for two bit cells, amongst other features, and respective fabrication processes in accordance with aspects of the present disclosure.
Figure 5B:
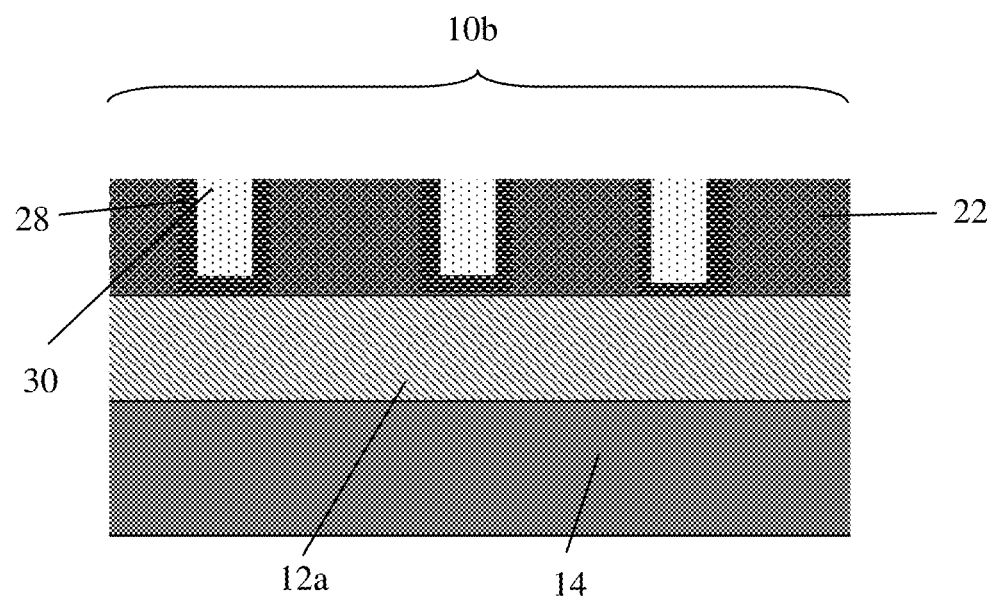

FIGS. 5A and 5B show cross-sectional views of the top electrode and a shared bottom electrode for two bit cells, amongst other features, and respective fabrication processes in accordance with aspects of the present disclosure. FIG. 5A shows a cross-sectional view perpendicular to the bitcell; whereas, FIG. 5B shows a cross-sectional view parallel to the bit cell. Referring now to both FIGS. 5A and 5B, the bottom electrode 22, the switching material 24, the top electrode material 26, the advance etch stop layer 28 and the insulator material 30 are subjected to a CMP polish. By performing the CMP polish, the top electrode material 26 is formed into a first top electrode 26a and a second top electrode 26b, both of which share the bottom electrode 22. Also, as shown in FIGS. 5A and 5B, the switching material 24 will be an intervening layer between the top electrodes 26a, 26b, and bottom electrode 22. In this way, the fabrication processes described herein can form a two bit cell with a common bottom electrode 22.

Figure 6:
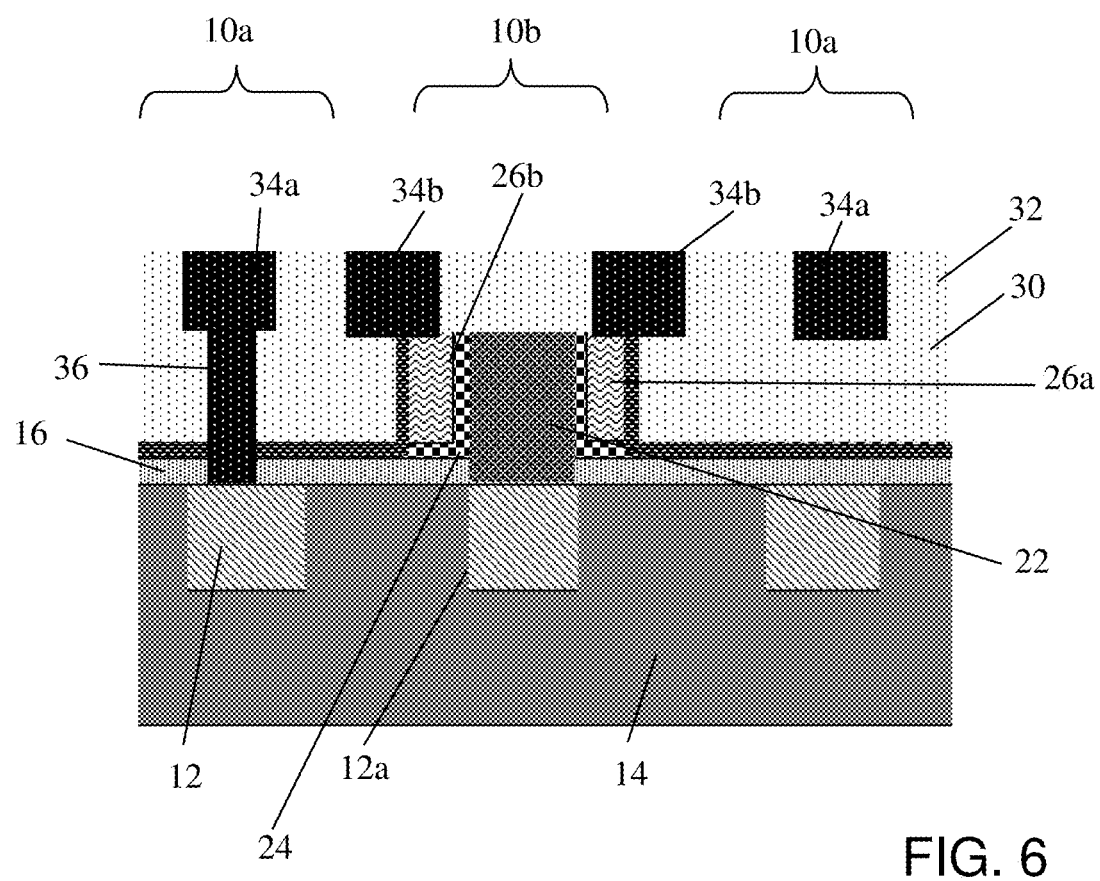
FIG. 6 shows the memory cells with contacts and respective fabrication processes in accordance with aspects of the present disclosure.

FIG. 6 shows the memory cells with contacts and respective fabrication processes in accordance with aspects of the present disclosure. More specifically, an interlevel dielectric material 32 is deposited on the planarized surface, e.g., over the top electrodes 26a, 26b. In embodiments, the dielectric material 32 is an oxide material deposited by a conventional CVD process. Following the deposition process, contacts 34a, 34b and via interconnects 36 can be formed in the dielectric material 32 using conventional, lithography, etching, deposition and planarizing processes as already described herein. In embodiments, the contact 34a and via interconnect 36 can be formed by two single damascene processes or a dual damascene process, connecting to the underlying metallization features 12 in the periphery area 10a. The contacts 34b are formed in electrical contact with the respective top electrodes 26a, 26b in the memory area 10b, thereby forming two distinct memory cells sharing the same bottom contact 22.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprises:
forming a bottom electrode on a bottom metallization feature;
forming an etch stop layer contacting a lower portion of sidewalls of the bottom electrode;
forming switching material about sidewalls and an upper surface of the bottom electrode and on top of the etch stop layer;
forming top electrode material on the switching material;
patterning the switching material and the top electrode material to form a first top electrode comprising the top electrode material and a second top electrode of a two bit cell with the bottom electrode common to both the first top electrode and the second top electrode, wherein the patterning of the switching material removes the switching material from the upper surface of the bottom electrode and over portions of the etch stop layer such that the switching material is sandwiched between the sidewalls of the bottom electrode and the first electrode and sandwiched between the sidewalls of the bottom electrode and the second electrode;
forming an additional etch stop layer lining sidewalls of the first top electrode and the second top electrode, and contacting a portion of the switching material such that the first electrode and the second electrode are sandwiched between the additional etch stop layer and the switching material;
forming a first contact partially extending over and contacting a top surface of the first top electrode, and further contacting a top surface of the additional etch stop layer; and
forming a second contact partially extending over and contacting a top surface of the second top electrode, and further contacting the top surface of the additional etch stop layer.

2. The method of claim 1, wherein:
the additional etch stop layer is formed in contact with the first top electrode and the second top electrode, on a surface opposing to the switching material; and
the etch stop layer is formed under the additional etch stop layer and above the lower metallization feature, which is under the bottom electrode.

3. The method of claim 1, wherein the first top electrode and the second top electrode share the bottom electrode in a 2-bit cell configuration.

4. The method of claim 1, wherein the first top electrode and the bottom electrode are a first bit cell and the second top electrode and the bottom electrode are a second bit cell, wherein the first top electrode, the bottom electrode and the second top electrode are formed in direct contact with the switching material therebetween.

5. The method of claim 4, wherein the switching material is a high-k dielectric material.

6. The method of claim 1, wherein the first top electrode and the second top electrode are formed of a same material.

7. The method of claim 6, wherein the bottom electrode is formed of a different material than the first top electrode and the second top electrode.

8. The method of claim 1, wherein the first top electrode is formed on a first side of the bottom electrode and the second top electrode is formed on a second side of the bottom electrode, and the switching material is formed as an intervening material between and directly contacting the bottom electrode and the first and second top electrodes.

9. The method of claim 8, wherein the etch stop layer separates plural bottom electrodes.

* * * * *